United States Patent
Heikkila

(10) Patent No.: US 7,227,920 B2
(45) Date of Patent: Jun. 5, 2007

(54) CIRCUIT AND METHOD FOR CORRECTING CLOCK DUTY CYCLE

(75) Inventor: Juha M. Heikkila, Oulu (FI)

(73) Assignee: Nokia Corporation, Espoo (FI)

( * ) Notice: Subject to any disclaimer, the term of this patent is extended or adjusted under 35 U.S.C. 154(b) by 944 days.

(21) Appl. No.: 09/891,726

(22) Filed: Jun. 26, 2001

(65) Prior Publication Data

US 2002/0196887 A1 Dec. 26, 2002

(51) Int. Cl.
H04L 7/00 (2006.01)
(52) U.S. Cl. .................. 375/371; 375/373; 327/161
(58) Field of Classification Search ............... 375/371, 375/368, 359, 376, 373; 327/161
See application file for complete search history.

(56) References Cited

U.S. PATENT DOCUMENTS 3,629,712 A * 12/1971 Clark ........................ 328/109

(Continued)

FOREIGN PATENT DOCUMENTS

EP 0 800 275 A1 10/1997

OTHER PUBLICATIONS

Lee et al., "Low-Noise Fast-Lock Phase-Locked Loop with Adaptive Bandwith Control", IEEE Journal of Solid-State Circuits, vol. 35, No. 8, Aug. 2000.*

(Continued)

Primary Examiner—Temesghen Ghebretinsae
(74) Attorney, Agent, or Firm—Harrington & Smith, PC

(57) ABSTRACT

Disclosed is a circuit for controlling the duty cycle and jitter of a clock signal. The circuit has an input node for receiving the clock signal and an output node for outputting a processed clock signal having a first edge that is synchronized to an edge of the clock signal and a second edge that is varied so as to provide a predetermined processed clock signal duty cycle. The predetermined duty cycle is preferably a 50—50 duty cycle. The output node may be coupled to baseband circuitry of a wireless communications terminal, such as a cellular telephone. The circuit is constructed to include a plurality of serially connected delay elements that are coupled to the clock signal at the input node. The plurality of delay elements together introduce a nominal one cycle delay into the clock signal. The circuit also includes a phase detector having a first input signal coupled to the clock signal and a second input coupled to an output of the plurality of delay elements for receiving a delayed clock signal therefrom. The phase detector operates so as to generate an error signal that is indicative of a phase difference between the clock signal and the delayed clock signal. The error signal is coupled to at least one of the delay elements for controlling the delay element for minimizing the phase difference between the clock signal and the delayed clock signal. The circuit also includes a first divider circuit having an input coupled to the clock signal, a second divider circuit having an input coupled to an output of a first one of the plurality of delay elements for receiving a one half cycle delayed clock signal therefrom, and a gate having inputs coupled to outputs of the first and second divider circuits and an output coupled to the output node for outputting the processed clock signal.

10 Claims, 3 Drawing Sheets

U.S. PATENT DOCUMENTS

| | | | | |
|---|---|---|---|---|
| 4,354,188 A | * | 10/1982 | Schneider | 377/48 |
| 4,712,224 A | * | 12/1987 | Nelson | 377/43 |
| 5,270,643 A | * | 12/1993 | Richardson et al. | 324/751 |
| 5,425,017 A | * | 6/1995 | Copley et al. | 370/13 |
| 5,442,324 A | * | 8/1995 | Brauns | 331/34 |
| 5,514,990 A | | 5/1996 | Mukaine et al. | 327/116 |
| 5,532,632 A | * | 7/1996 | Kent | 327/141 |
| 5,565,761 A | * | 10/1996 | Hwang | 323/222 |
| 5,883,534 A | | 3/1999 | Kondoh et al. | 327/156 |
| 6,263,192 B1 | * | 7/2001 | Alderton | 455/73 |
| 6,339,833 B1 | * | 1/2002 | Guo | 714/55 |
| 6,380,774 B2 | * | 4/2002 | Saeki | 327/119 |
| 6,424,178 B1 | * | 7/2002 | Harrison | 326/93 |
| 6,594,806 B1 | * | 7/2003 | Casavant | 716/6 |
| 6,606,361 B1 | * | 8/2003 | Rowell | 375/355 |
| 6,741,668 B1 | * | 5/2004 | Nakamura | 375/376 |
| 6,781,419 B2 | * | 8/2004 | Harrison | 326/95 |
| 6,844,895 B1 | * | 1/2005 | Billerbeck et al. | 348/211.2 |
| 6,950,486 B2 | * | 9/2005 | Araki | 375/360 |
| 2002/0085657 A1 | * | 7/2002 | Boerstler | 375/373 |
| 2003/0013412 A1 | * | 1/2003 | Kardach et al. | 455/41 |

OTHER PUBLICATIONS

"ASMD With Duty Cycle Correction Scheme For High-Speed DRAM"; Jang, S. et al; Electronic Letters; vol. 37, Issue 16; Aug. 2, 2001; pp. 1004-1006.

"The Anti Jitter Circuit for the Suppression of Wideband Phase-Noise"; Underhill, M.J.; IEEE Colloquium on Microwave and Millimeter-Wave Oscillators and Mixers (Ref. No. 1998/480); Dec. 1, 1998; pp. 2/1-2/14.

"Sampling Jitter in High-Speed SI Circuits.pdf"; Jonsson, B.E.; IEEE International Symposium on Circuits and Systems; vol. 1; 1998; pp. 524-526.

"Effect Of Sample Clock Jitter On IF-Sampling IS-95 Receivers. pdf"; Stewart, K.A.; The 8th IEEE International Symposium on Personal, Indoor and Mobile Radio Communications; vol. 2; 1997; pp. 366-370.

"Design Of High-Speed, Low Power Frequency Dividers And Phase-Locked loops in Deep Submicron CMOS"; Razavi, B. et al; IEEE Journal of Solid State Ciruits; vol. 30, No. 2; Feb. 1995; pp. 101-109.

* cited by examiner

CIRCUIT AND METHOD FOR CORRECTING CLOCK DUTY CYCLE

TECHNICAL FIELD

These teachings relate generally to electronic circuitry that generates synchronizing signals, such as clock signals, and relates more specifically to circuitry for controlling, regulating and correcting the generated synchronizing signals.

BACKGROUND

Clock signals are well known in the art for controlling and synchronizing the operation of electronic circuits and systems. In a typical case there will be a master or system highest frequency clock signal from which all other lower frequency clock signals are derived. These various clock signals are distributed throughout the electronic system and are provided to various types of circuits, such as microprocessors, input/output circuits, analog-to-digital and digital-to-analog converts, dynamic memory controllers and the like.

A modern wireless communications terminal, such as a cellular telephone, is a complex data processing system that requires accurate and reliable clock signals. As an example, in the evolving third generation (3G) terminals the system the system clock is increased to 38.4 MHz, and is utilized by the baseband processing circuitry for sampling the received and transmitted signals. The increase in the frequency of the system clock is due at least in part to the higher dynamic range requirement of the RF interface analog-to-digital converter(s) (ADC) and digital-to-analog converter(s) (DAC). These circuits are used to convert the received In-phase and Quadrature (RX I/Q) signals and the transmitted I/Q (TX I/Q) signals from analog-to-digital and from digital-to-analog, respectively. The system clock may be generated from a crystal oscillator, in a well-known fashion.

The RF interface ADC and DAC require a high quality clock signal, i.e., one having low jitter and a repeatable and stable duty cycle. As may be appreciated, as the system clock frequency is increased it becomes more difficult to provide the desired high quality system clock signal.

In an exemplary application the system clock, when generated by a crystal oscillator circuit, is intended to be a pure sine wave at the desired frequency. However, in practice the system clock signal will also contain undesired harmonic frequencies. These harmonic frequencies and other error sources tend to cause the generation of a non-ideal duty cycle in the clock signal fed to the baseband circuitry, including the ADC and the DAC. In fact, the actual duty cycle variation may be ±10% or even more.

It can be realized that as the system clock frequency is increased the ADC and DAC conversion and cycle times are decreased proportionately, making the clock duty cycle requirement more critical. Typically one half of the clock signal is used for sampling the input signal to be converted which, at a clock frequency of 38.4 MHz, translates to about 13 nanoseconds. If one then factors in the possible worst case duty cycle variations, the actual converter sampling times can be reduced to less than 12 nanoseconds. As is well known in the art, as the converter sampling times are reduced the converter cost, complexity and power consumption typically increase, in order to maintain a desired level of performance. As a general rule, a doubling of the sampling frequency results in a four times increase in power consumption. In a portable, battery powered device, such as a wireless communication terminal, any increase in power consumption is detrimental, as it can translate to reduced talk and standby times.

One technique for correcting the clock signal duty cycle variation is through the use of a phase locked loop (PLL) circuit. However, and depending on the implementation, the use of the PLL can increase the clock signal jitter (indeterminancy in the occurrence of the clock signal edges), which is unacceptable from the point of view of the baseband converters. An increase in clock signal jitter typically results in an increase in complexity and cost in order to compensate the converter circuits for the jitter.

SUMMARY

The foregoing and other problems are overcome by methods and apparatus in accordance with embodiments of these teachings.

A circuit is disclosed for controlling the duty cycle and jitter of a clock signal. The circuit has an input node for receiving the clock signal and an output node for outputting a processed clock signal having a first edge that is synchronized to an edge of the clock signal and a second edge that is varied so as to provide a predetermined processed clock signal duty cycle. The predetermined duty cycle is preferably a 50—50 duty cycle.

In the preferred embodiment the output node is coupled to baseband circuitry of a wireless communications terminal, such as a cellular telephone.

The circuit is constructed to include a plurality of serially connected delay elements that are coupled to the clock signal at the input node. The plurality of delay elements together introduce a nominal one cycle delay into the clock signal. The circuit also includes a phase detector having a first input signal coupled to the clock signal and a second input coupled to an output of the plurality of delay elements for receiving a delayed clock signal therefrom. The phase detector operates so as to generate an error signal that is indicative of a phase difference between the clock signal and the delayed clock signal. The error signal is coupled to the delay elements for controlling the delay elements for minimizing the phase difference between the clock signal and the delayed clock signal. The circuit also includes a first divider circuit having an input coupled to the clock signal, a second divider circuit having an input coupled to an output of the first one of the plurality of delay elements for receiving a one half cycle delayed clock signal therefrom, and a gate having inputs coupled to outputs of the first and second divider circuits and an output coupled to the output node for outputting the processed clock signal.

BRIEF DESCRIPTION OF THE DRAWINGS

The above set forth and other features of these teachings are made more apparent in the ensuing Detailed Description of the Preferred Embodiments when read in conjunction with the attached Drawings, wherein.

DETAILED DESCRIPTION OF THE PREFERRED EMBODIMENTS

Figure 1:
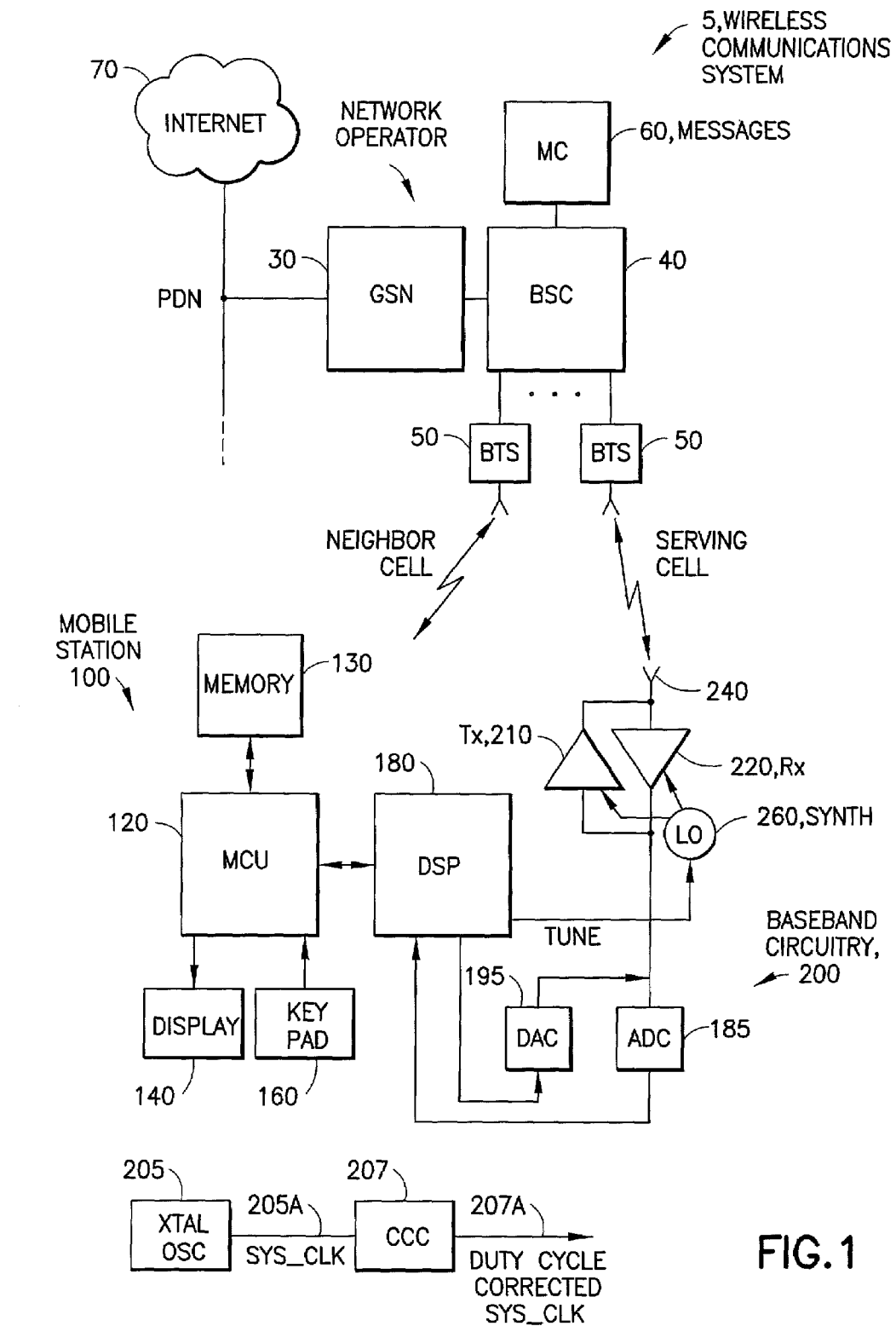
FIG. 1 is a block diagram of an embodiment of a wireless communications system that includes a wireless communications terminal that is suitable for practicing these teachings.

Referring first to FIG. 1, there is illustrated a simplified block diagram of an embodiment of a wireless communications system 5, in particular a wireless communications terminal or mobile station (MS) 100, that is suitable for practicing these teachings. The MS 100 may be embodied as a handheld cellular telephone, a vehicle-installed cellular telephone, a personal communication device, a personal data assistant (PDA) device having wireless communication capabilities, a wireless communication module installable within or with a computer, such as a PCMCIA or similar type of card or module that is installed during use within a portable data processor, such as a laptop or notebook computer, or even a computer that is wearable by the user. In general, the MS 100 may be any device capable of bidirectional communication with a wireless network.

FIG. 1 also shows an exemplary network operator 10 having, for example, a GPRS Support Node (GSN) 30 for connecting to a telecommunications network, such as a Public Packet Data Network or PDN. The GPRS, or General Packet Radio Service, is a GSM phase 2+ service in which radio resources for data transfer are allocated on a per block basis, as opposed to a circuit-switched basis. This is an exemplary embodiment, as these teachings also apply to 3G systems. The network operator 10 also includes at least one base station controller (BSC) 40 as well as a plurality of base transceiver stations (BTS) 50 that transmit in a forward or downlink direction both physical and logical channels to the mobile station 100 in accordance with the predetermined air interface standard. A reverse or uplink communication path also exists from the mobile station 100 to the network operator, and conveys mobile originated access requests and traffic.

Each BTS 50 is assumed to support a cell. The BTS 50 through which the MS 100 is currently receiving service is considered to be the serving cell BTS, while at least one other BTS 50 is assumed to be supporting a neighboring cell.

The air interface standard can conform to any standard that enables voice and/or packet data transmissions to occur to and from the mobile station 100, such as packet data transmissions enabling Internet 70 access and web page downloads. In the presently preferred embodiment of these teachings the air interface standard is the Time Division Multiple Access (TDMA) air interface that supports a GSM or an advanced GSM protocol and air interface, although these teachings are not intended to be limited solely to GSM or GSM-related wireless systems.

The network operator 10 may also include a Message Center (MC) 60 that receives and forwards messages for the mobile stations 100. Other types of messaging service may include Supplementary Data Services and one under currently development and known as Multimedia Messaging Service (MMS), wherein image messages, video messages, audio messages, text messages, executables and the like, and combinations thereof, can be transferred between the network and the mobile station 100.

The mobile station 100 typically includes a microcontrol unit (MCU) 120 having an output coupled to an input of a display 140 and an input coupled to an output of a keyboard or keypad 160. The MCU 120 is assumed to include or be coupled to some type of a memory 130, including a read-only memory (ROM) for storing an operating program, as well as a random access memory (RAM) for temporarily storing required data, scratchpad memory, received packet data, packet data to be transmitted, and the like. A separate, removable SIM (not shown) can be provided as well, the SIM storing, for example, a preferred Public Land Mobile Network (PLMN) list and other subscriber-related information. The ROM is assumed to store a program enabling the MCU 120, in cooperation with a DSP 180 described below, to execute the software routines, layers and protocols required to implement the functions of the wireless communications terminal, including the provision of a suitable user interface (UI), via display 140 and keypad 160, with a user. Although not shown, a microphone and speaker are typically provided for enabling the user to conduct voice calls in a conventional manner.

The mobile station 100 also contains a wireless section that includes the digital signal processor (DSP) 180, or equivalent high speed processor, as well as a wireless transceiver that includes a transmitter 200 and a receiver 220, both of which are coupled to an antenna 240 for communication with the network operator. The DSP 180 may implement, or receive an input from, an ADC 185 used for digitizing received signal samples of neighbor and same cell traffic and control channel transmissions. A DAC 195 is also provided for converting signals from the DSP 180 into a suitable analog format for modulating a transmission carrier. For simplicity, only one ADC 185 and one DAC 195 are shown in FIG. 1. However, in a typical implementation there will be at least two ADCs 185, one for the received I signal and one for the received Q signal, as well as two DACs 195, one for the transmitted I signal and one for the transmitted Q signal. At least one local oscillator (LO) 260, such as a frequency synthesizer, may be provided for tuning the transceiver. Data, such as digitized voice and/or packet data, is transmitted and received through the antenna 240.

The ADC 185 and the DAC 195 are included in a baseband section 200 of the MS 100. An oscillator, such as a crystal oscillator 205, generates a system clock (SYS_CLK) signal 205A (e.g., a 38.4 MHz signal). The SYS_CLK signal 205A is input to a clock correction circuit (CCC) 207 which outputs a duty cycle and jitter corrected SYS_CLK signal 207A in accordance with these teachings.

Figure 2:
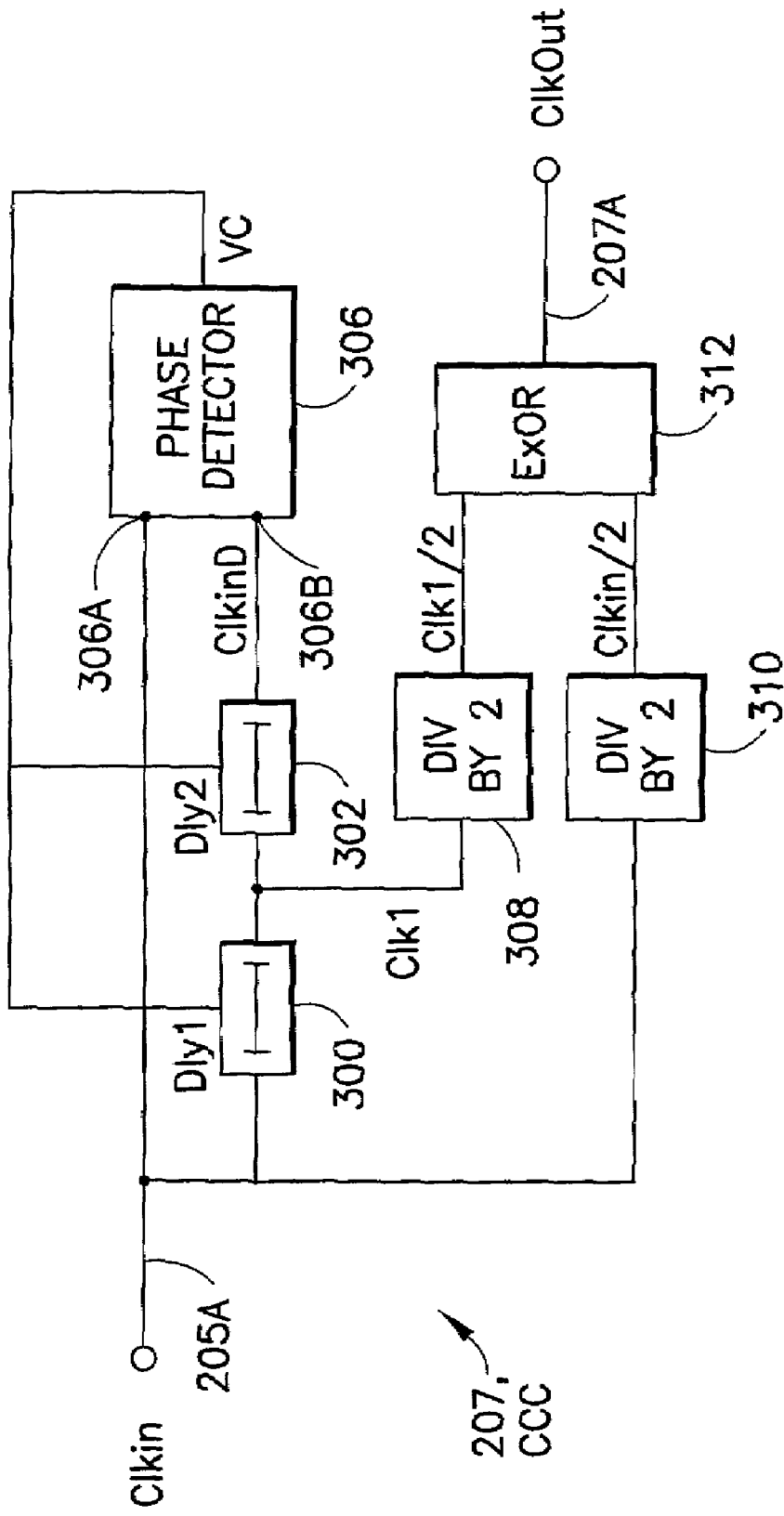
FIG. 2 is a circuit diagram of the clock control circuit shown in FIG. 1.

FIG. 2 is a circuit diagram that shows the construction of the CCC 207. The operation of the CCC 207 exploits the fact that from the perspective of the ADC 185 only one edge of SYS_CLK is required to be jitter free, i.e., the clock edge that defines the end of the sampling period, whereas the instant in time when the sampling period is started is not as critical. These criteria are used by the CCC 207 to provide one edge of the corrected SYS_CLK 207A to be jitter free, while the other edge is allowed some jitter, and is the edge at which duty cycle correction is accomplished. The goal is to provide a nominally 50—50 duty cycle, that is, within a single system clock cycle the clock signal high and low times are equal. However, in other embodiments the duty cycle need not be 50—50, but could be controlled to be any desired ratio (e.g., 60-40, 70-30, 45-55, and so forth.)

The CCC 207 includes first and second controllable delay elements Dly1 300 and Dly2 302, a phase detector 306, first and second divide by two circuits 308 and 310, and a logic gate, preferably an Exclusive OR (EXOR) gate 312. The ClkIn signal node receives the SYS_CLK signal 205A, and the ClkOut signal node outputs the corrected SYS_CLK signal 207A.

Figure 3:
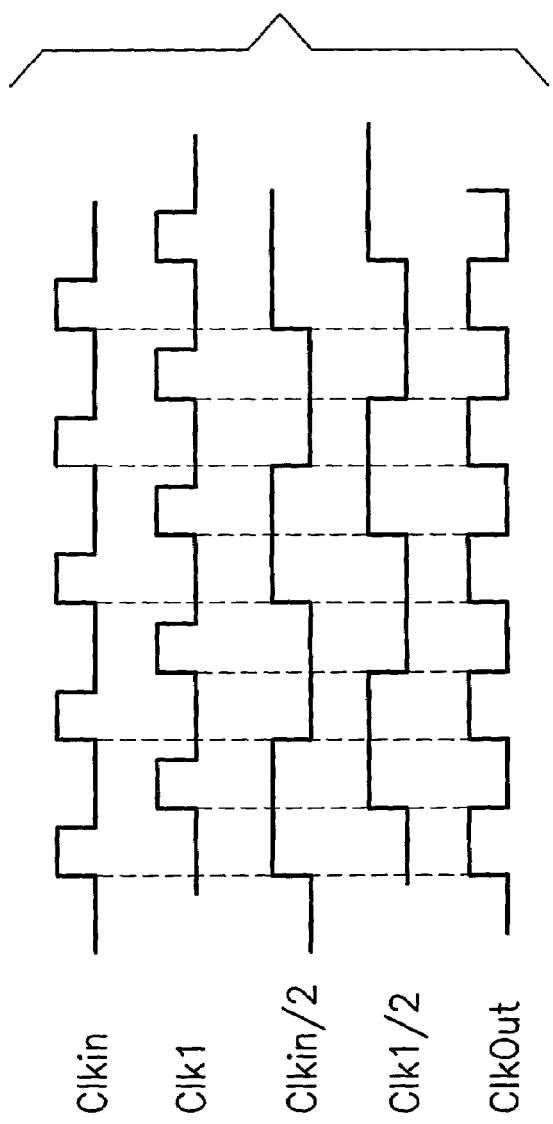
FIG. 3 is a waveform diagram that is illustrative of the operation of the clock control circuit.

The operation of the CCC 207 will now be described in conjunction with the waveform diagram shown in FIG. 3.

Figure 4:
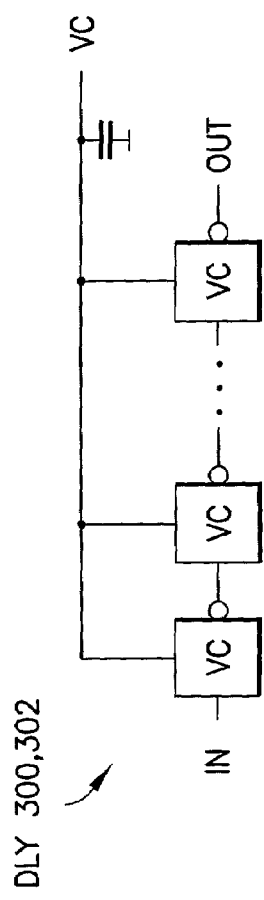
FIG. 4 depicts an exemplary delay line with a variable delay.

In the illustrated embodiment Dly1 300 has a tuneable delay period of one half the SYS_CLK period and Dly2 302 also has a tuneable delay period of one half the SYS_CLK period. The total delay (Dly1+Dly2) is thus equal to the SYS_CLK 205A period. For example, for a SYS_CLK 205A frequency of 38.4 MHz Dly1 and Dly2 each have a nominal delay of about 13 nanoseconds, and the total delay (Dly1+Dly2) is about 26 nanoseconds. Note in FIG. 3 that the ClkIn signal (SYS_CLK 205A) need not have a 50—50 duty cycle, or even a nominally 50—50 duty cycle. SYS_CLK 205A and the delayed SYS_CLK signals are fed to input nodes 306A and 306B, respectively, of the phase detector 306. The phase detector 306 is responsive to one of its two inputs leading or lagging the other for outputting an error signal that is used to adjust the delay times of Dly1 300 and Dly2 302 so as to drive the amount of lead or lag towards zero. The goal is to place the ClkIn signal (SYS_CLK 205A) in exact phase alignment with the nominally one cycle delayed ClkIn signal (ClkInD) at the input nodes 306A and 306B of the phase detector 306. FIG. 4 illustrates one embodiment of the variable delay element 300 or 302 that is responsive to the (analog) output signal (VC) from the phase detector 306.

Meanwhile, ClkIn (SYS_CLK 205A) and the nominally half cycle delayed ClkIn signal (Clk1) are both divided by two in divide by 2 circuits 308 and 310, and the resulting signals ClkIn/2 and Clk1/2, respectively, are fed to EXOR 312. The output of the EXOR 312 gives the desired 50—50 duty cycle corrected ClkOut signal (corrected SYS_CLK 207A).

As a result of the operation of the CCC 207, the rising edge (↑) of ClkOut is synchronous with the rising edge of ClkIn (SYS_CLK 205A), and is thus clean and jitter-free, while the falling edge has increased jitter due to the duty cycle adjustment performed by the phase detector 306, in cooperation with Dly1 300 (the rising edge of the varying Clk1) and Dly2 302. As was discussed above, at least for the ADC 185 the more important clock edge is the one that defines the end of the sampling period (the rising edge of ClkOut in this case), while the jitter occurring at the other edge (the falling edge in this case) is not as critical. It can be seen that the operation of the CCC 207 beneficially provides the nominally 50—50 duty cycle corrected SYS_CLK 207A signal, where one edge of the clock signal is essentially jitter free.

It can be appreciated that the foregoing embodiment, by improving the quality of the MS 100 system clock, enables a power savings to be realized, as well as an overall reduction in cost and complexity. The use of these teachings enables higher frequency system clocks to be utilized, without incurring the disadvantages incurred by the use of higher frequency clocks, and may also relax the requirements of the crystal oscillator 205, thereby realizing even further cost savings.

While described in the context of specific frequencies, duty cycles and the like, it is to be understood that these are exemplary, and are not intended to be read in a limiting sense upon the practice of these teachings.

Further by example, while both Dly1 300 and Dly2 302 have been described as being variable delay devices, they need not have identical delays, and furthermore it is within the scope of these teachings to make only Dly1 300 a variable delay device, and to make Dly2 302 a fixed, nominally half cycle or any other suitable delay element.

Thus, while these teachings have been particularly shown and described with respect to preferred embodiments thereof, it will be understood by those skilled in the art that changes in form and details may be made therein without departing from the scope and spirit of these teachings.

What is claimed is:

1. A circuit for controlling a duty cycle and jitter of a clock signal, comprising:
    an input node for receiving the clock signal;
    a plurality of serially connected delay elements coupled to the input node, said plurality of delay elements creating a delayed clock signal;
    a phase detector having a first input coupled to said clock signal and a second input coupled to an output of said plurality of delay elements for receiving a delayed clock signal therefrom, said phase detector operating so as to generate an error signal that is indicative of a phase difference between said clock signal and said delayed clock signal, said error signal being coupled to at least a first one of said delay elements for controlling said at least one delay element for minimizing the phase difference between said clock signal and said delayed clock signal;
    a first divider circuit having an input coupled to said clock signal;
    a second divider circuit having an input coupled to an output of said first one of said plurality of delay elements for receiving the delayed clock signal therefrom;
    a gate having inputs coupled to outputs of said first and second divider circuits and an output; and
    an output node coupled to the output of the gate far outputting a processed clock signal having a first edge that is synchronized to an edge of the clock signal and a second edge that is controlled so as to provide a predetermined processed clock signal duty cycle.

2. A circuit as in claim 1, wherein said predetermined duty cycle is a nominally 50—50 duty cycle.

3. A circuit as in claim 1, wherein said output node is coupled to baseband circuitry of a wireless communications terminal.

4. A method comprising: receiving a clock signal;
    generating a delayed clock signal;
    generating an error signal that is indicative of a phase difference between the clock signal and the delayed clock signal;
    minimizing the phase difference between the clock signal and the delayed clock signal in accordance with the error signal;
    dividing both the clock signal and the delayed clock signal, creating a modified clock signal and a modified delayed clock signal; and
    performing an exclusive or operation between the modified clock signal and modified delayed clock signal to create a processed clock signal the processed clock signal having a first edge that is synchronized to an edge of the clock signal and a second edge that is controlled so as to provide a predetermined processed clock signal duty cycle.

5. A method as in claim 4, wherein the predetermined duty cycle is a 50—50 duty cycle.

6. A method as in claim 4, further comprising coupling the processed clock signal to baseband circuitry of a wireless communications terminal.

7. A method as in claim 4, wherein the first edge of the processed clock signal is a rising edge that is synchronized to a rising edge of the clock signal.

8. A method as in claim 4 wherein the first edge of the processed clock signal is relatively jitter free in comparison to the second edge of the processed clock signal.

9. A circuit comprising an input configured to receive a clock signal;

delay elements coupled to the input, the delay elements configured to generate a delayed clock signal;

a phase detector coupled to the input and to the delay elements, the phase detector configured to generate an error signal that is indicative of a phase difference between the clock signal and the delayed clock signal;

the delay elements coupled to the phase detector, the delay elements further configured to minimize the phase difference between the clock signal and the delayed clock signal in accordance with the error signal;

dividing elements coupled to the input and to the delay elements, the dividing elements configured to divide both the clock signal and the delayed clock signal to create a modified clock signal and a modified delayed clock signal;

an exclusive or element coupled to the dividing elements, the exclusive or element configured to perform an exclusive or operation between the modified clock signal and modified delayed clock signal, the exclusive or element creating a processed clock signal, the processed clock signal having a first edge that is synchronized to an edge of the clock signal and a second edge that is controlled so as to provide a predetermined processed clock signal duty cycle; and an output configured to output the processed clock signal, the output coupled to the exclusive or element.

10. A circuit as in claim 9 wherein the first edge of the processed clock signal is relatively jitter free in comparison to the second edge of the processed clock signal.

* * * * *